(12) United States Patent
Cai

(10) Patent No.: US 12,096,652 B2
(45) Date of Patent: Sep. 17, 2024

(54) DISPLAY PANEL AND DISPLAY APPARATUS

(71) Applicant: WUHAN TIANMA MICROELECTRONICS CO., LTD., Wuhan (CN)

(72) Inventor: Yu Cai, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 442 days.

(21) Appl. No.: 17/504,161

(22) Filed: Oct. 18, 2021

(65) Prior Publication Data

US 2022/0037622 A1     Feb. 3, 2022

(30) Foreign Application Priority Data

Jul. 9, 2021   (CN) .......................... 202110776252.3

(51) Int. Cl.
*H10K 50/856*     (2023.01)
*H10K 50/86*     (2023.01)

(52) U.S. Cl.
CPC ......... *H10K 50/856* (2023.02); *H10K 50/865* (2023.02)

(58) Field of Classification Search
CPC .. H10K 50/856; H10K 50/865; H10K 50/858; H10K 59/38; H10K 59/40; H10K 2102/351; H10K 59/12; H10K 50/85; H01L 27/156; H01L 33/58; H01L 33/60
See application file for complete search history.

(56) References Cited

U.S. PATENT DOCUMENTS

2020/0357856 A1*   11/2020   Koo ..................... H10K 59/879

FOREIGN PATENT DOCUMENTS

CN          111916474 A     11/2020
WO       2020/171370 A1     8/2020

* cited by examiner

*Primary Examiner* — Donald L Raleigh
(74) *Attorney, Agent, or Firm* — CHRISTENSEN O'CONNOR JOHNSON KINDNESS PLLC

(57) ABSTRACT

A display panel and a display apparatus are provided. The display panel includes first to third light extraction modules. An angle $\alpha_1$ between the first side surface and the first bottom surface satisfies $0<\alpha_1 \leq 90°$, and the first side surface is configured to convert at least part of a large-angle light emitted from the light-emitting module into a small-angle light. The second light extraction module is in contact with the first side surface, a refractive index $n_2$ of the second light extraction module and a refractive index $n_1$ of the first light extraction module satisfy: $n_2<n_1$. The third light extraction module includes a reflective surface configured to reflect a light incident to the reflective surface and located at a side of the third light extraction module close to the first side surface.

19 Claims, 11 Drawing Sheets

DISPLAY PANEL AND DISPLAY APPARATUS

CROSS-REFERENCE TO RELATED APPLICATIONS

The present application claims priority to Chinese Patent Application No. 202110776252.3, filed on Jul. 9, 2021, the content of which is incorporated herein by reference in its entirety.

TECHNICAL FIELD

The present disclosure relates to the field of display technologies, and, particularly, relates to a display panel and a display apparatus.

BACKGROUND

With continuous development of science and technology, more and more display apparatuses are widely used in people's daily life and work, and become an indispensable and important tool for people today. As user's requirements on display apparatuses become more and more demanding, various display screens emerge in which display technologies such as liquid crystal display and organic light-emitting display are applied. Moreover, based on this research and development, technologies, such as 3D display, touch display, curved display, and ultra-high resolution display arise. Improving light extraction efficiency of a light-emitting component in such display panels has become a focus of research.

SUMMARY

In a first aspect of the present disclosure, a display panel is provided. The organic light-emitting display panel includes a substrate, a light-emitting modules located at a side of the substrate, a first light extraction module located at a side of one light-emitting module of the light-emitting modules facing away from the substrate, a second light extraction module located at a side of the first light extraction module facing away from the substrate, and a third light extraction module located at a side of the second light extraction module facing towards the substrate. The first light extraction module includes a first side surface and a first bottom surface facing towards the substrate, an angle $\alpha_1$ formed between the first side surface and the first bottom surface satisfies $0<\alpha_1 \leq 90°$, and the first side surface is configured to convert at least part of a large-angle light emitted from the one light-emitting module into a small-angle light. The second light extraction module is in contact with the first side surface and has a refractive index $n_2$, and the first light extraction module has a refractive index $n_1$, where $n_2<n_1$. The third light extraction module includes a reflective surface located at a side of the third light extraction module close to the first side surface and configured to reflect light incident to the reflective surface.

In a second aspect of the present disclosure, a display apparatus including the above display panel is provided.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate only A, both A and B, and only B. In addition, the symbol "/" in the context generally indicates that the relation between the objects in front and at the back of "/" is an "or" relationship.

It should be understood that although the terms 'first', 'second' and 'third' can be used in the present disclosure to describe light extraction modules, these light extraction modules should not be limited to these terms. These terms are used only to distinguish the light extraction modules from each other. For example, without departing from the scope of the embodiments of the present disclosure, a first light extraction module can also be referred to as a second light extraction module. Similarly, the second light extraction module can also be referred to as the first light extraction module.

Figure 1:
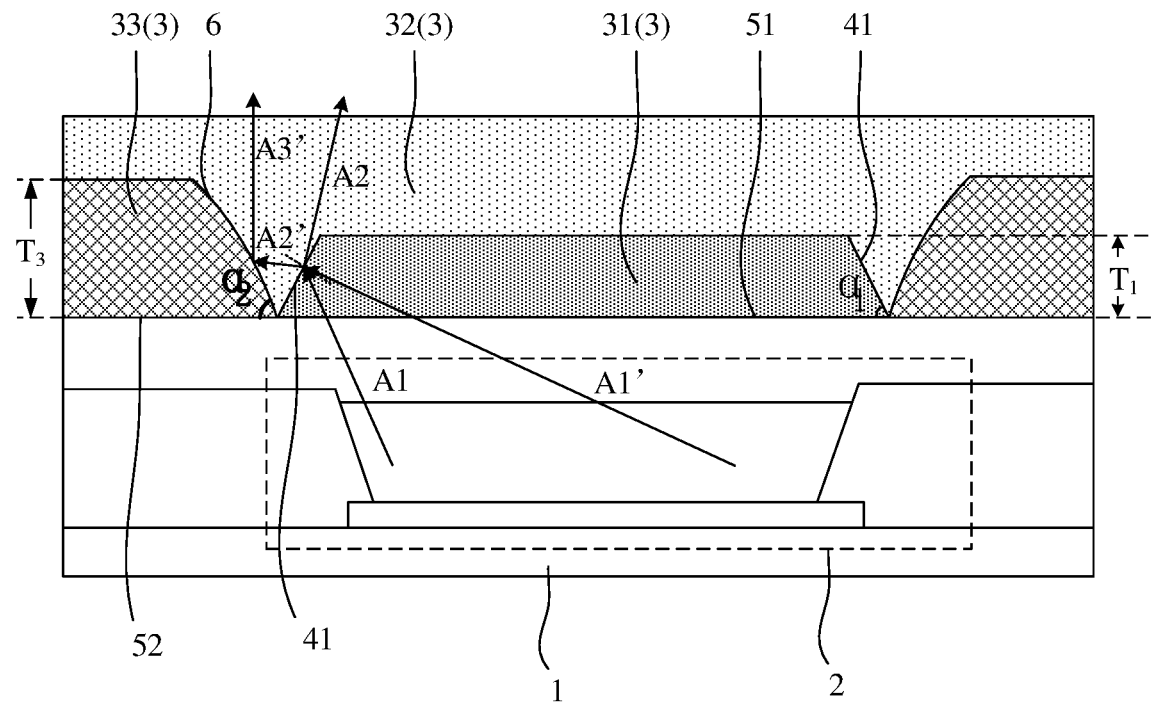
FIG. 1 is a schematic cross-sectional view showing a display panel according to an embodiment of the present disclosure.

The present disclosure provides a display panel. FIG. 1 is a schematic cross-sectional view showing a display panel according to an embodiment of the present disclosure. As shown in FIG. 1, the display panel includes a substrate 1, a light-emitting module 2 and a light extraction layer 3. The light extraction layer 3 is located at a side of the light-emitting module 2 facing away from the substrate 1. The light extraction layer 3 is configured to adjust a propagation direction of a large-angle light emitted from the light-emitting module 2, so that at least part of lights propagating in a large-angle direction is adjusted to propagate in a small-angle direction. The light propagating in the large-angle direction refers to a light emitted from the light-emitting module 2, which is obliquely transmitted and has a transmission direction greatly deviated from a front viewing angle direction. The light propagating in a small-angle direction refers to a light emitted from the light-emitting module 2, which is transmitted by tending to the front viewing angle direction relative to large-angle light.

Exemplarily, as shown in FIG. 1, the light extraction layer 3 includes a first light extraction module 31, a second light extraction module 32 and a third light extraction module 33.

The first light extraction module 31 is located at a side of the light-emitting module 2 facing away from the substrate 1. The first light extraction module 31 includes a first side surface 41 and a first bottom surface 51 facing towards the substrate 1. An angle m formed between the first side surface 41 and the first bottom surface 51 satisfies: $0<\alpha_1 \leq 90°$. That is, the first light extraction module 31 has a cross section with a trapezoid shape along a direction shown in FIG. 1.

The second light extraction module 32 is located at a side of the first light extraction module 31 facing away from the substrate 1, and is in contact with the first side surface 41. The second light extraction module 32 at least partially covers the first side surface 41. A refractive index $n_2$ of the second light extraction module 32 and a refractive index m of the first light extraction module 31 satisfy: $n_2<n_1$.

In an embodiment of the present disclosure, the first side surface 41 is configured to convert at least part of the large-angle light emitted from the light-emitting module 2 into the small-angle light. As shown in FIG. 1, for a large viewing angle light A1 emitted from the light-emitting module 2, the light A1 is refracted after it is incident to the first side surface 41. Compared with the incident light A1, the propagation direction of the refracted light A2 deflects toward a direction close to a normal line of the display panel. That is, the first light extraction module 31 and the second light extraction module 32 are arranged to match each other, which can increase light output amount of small-angle light, and increase brightness of the display panel in the front viewing angle direction, thereby improving light extraction efficiency of the light-emitting module 2.

Referring to FIG. 1, the third light extraction module 33 is located at a side of the second light extraction module 32 facing towards the substrate 1. The third light extraction module 33 includes a reflective surface 6 located at a side of the third light extraction module 33 close to the first side surface 41. The light incident to the reflective surface 6 can be reflected.

When the display panel displays images, as shown in FIG. 1, the light emitted from the light-emitting module 2 that propagates with a large-angle includes light A1' in addition to light A1. After the light A1' is incident to the first side surface 41, the refracted light can be deflected with a larger angle. The light A1' is incident through the first side surface 41, and then is refracted to be a light A2' schematically shown in FIG. 1. The refracted light A2' is subsequently reflected by the reflective surface 6, and a reflected light A3' can be deflected with a small-angle, that is, deflected with a direction facing towards the front viewing angle of the display panel.

In the present disclosure, the light extraction layer 3 includes the first light extraction module 31, the second light extraction module 32 and the third light extraction module 33, and materials, shapes and positions of the first light extraction module 31, the second light extraction module 32, and the third light extraction module 33 are matched, so that all of the first light extraction module 31, the second light extraction module 32 and the third light extraction module 33 can be used as a micro lens pattern (MLP). The micro lens pattern can adjust the light emitted from the light-emitting module 2 originally propagating in the large-angle direction to propagate in the small-angle direction, which can improve light extraction efficiency of the light-emitting module 2 and increase brightness of the display panel in the front viewing angle direction.

Exemplarily, based on the display panel having the structure shown in FIG. 1, in an embodiment of the present disclosure, a refractive index $n_3$ of the third light extraction module 33 and a refractive index $n_2$ of the second light extraction module 32 can satisfy: $n_3<n_2$. When the refracted light emitted from the first side surface 41 is incident to an interface between the third light extraction module 33 and the second light extraction module 32, since the refractive indexes satisfy the above relationship, that is, the light is incident from an optically denser medium to an optically thinner medium, the light will be totally reflected when an incident angle is greater than a critical angle. Therefore, the interface between the third light extraction module 33 and the second light extraction module 32 can naturally form the reflective surface 6. The reflective surface 6 is in contact with the second light extraction module 32. In this way, there is no need to additionally provide a reflective layer, thereby improving light extraction efficiency of the light-emitting module 2 while reducing a thickness of the display panel.

As shown in FIG. 1, the third light extraction module 33 includes a second bottom surface 52 facing towards the substrate 1. An angle $\alpha_2$ formed between the reflective surface 6 and the second bottom surface 52 satisfies: $0<\alpha_2\leq 90°$.

In the present disclosure, the reflective surface 6 can be a flat surface or a curved surface as shown in FIG. 1. When the reflective surface 6 is the curved surface, the angle formed between the reflective surface 6 and the second bottom surface 52 is an angle formed between a tangent plane of the reflective surface 6 at a position where the reflective surface 6 intersects with the second bottom surface 52 and the second bottom surface 52. In an embodiment of the present disclosure, by setting the angle $\alpha_2$ to satisfy: $0<\alpha_2\leq 90°$, the large-angle refracted light from the first side surface 41 can be better received, and the propagation direction of reflected light is closer to the normal line of the display panel.

Exemplarily, as shown in FIG. 1, a thickness $T_3$ of the third light extraction module 33 and a thickness $T_1$ of the first light extraction module 31 satisfy: $T_3 \geq T_1$. With such configuration, in case that an angle of the reflective surface 6 relative to the substrate 1 is constant, an area of the reflective surface 6 can be increased, so that the reflective surface 6 can reflect more large-angle refracted lights emitted from the first side surface 41.

In an embodiment of the present disclosure, $\alpha_2$ can be set larger. Exemplarily, in an embodiment of the present disclosure, $\alpha_2 \geq \alpha_1$. In case that the thickness of the third light extraction module 33 is constant, with such configuration, it can be avoided that the reflective surface 6 cannot receive part of the large-angle light emitted through the first side surface 41 due to a smaller $\alpha_2$. In an embodiment of the present disclosure, with the configuration where $\alpha_2 \geq \alpha_1$, light intensity that can be received by the reflective surface 6 can be achieved, so that intensity of light emitted from the display panel that propagates in the small-angle direction is increased, thereby improving brightness of the display panel at the front viewing angle.

In an embodiment of the present disclosure, $\alpha_1$ can satisfy $40°\leq\alpha_1\leq 60°$, and $\alpha_2$ can satisfy $65°\leq\alpha_2\leq 85°$. For the large-angle light incident to the first side surface 41, by setting $\alpha_1$ to be greater than or equal to 40°, the present disclosure can increase an incident angle (i.e., an angle formed between the large-angle light) when the large-angle light is incident to the first side surface 41, so that an emitting angle (an angle formed between the emitting light and a normal line of the first side surface 41) of the refracted light emitted from the first side surface 41 can be increased, thereby enabling the light emitted from the side surface 41 to emit at an angle as close as possible to the front viewing angle. In an embodiment of the present disclosure, by setting $\alpha_1$ to be smaller than or equal to 60°, in case that a thickness of the first light extraction module 31 is constant, the area of the first side surface 41 can be increased, so that more light propagating in a large-angle direction can be refracted through the first light extraction module 31 and then deflected in a small-angle direction.

In an embodiment of the present disclosure, the reflective surface 6 is configured to reflect the large-angle light emitted from the first side surface 41 to a direction facing towards the front viewing angle of the display panel. In an embodiment of the present disclosure, by setting $\alpha_2$ to be greater than or equal to 65°, the propagation direction of the reflected light reflected by the reflective surface 6 can be closer to the normal direction of the display panel. On the other hand, in an embodiment of the present disclosure, by setting $\alpha_2$ to be less than or equal to 85°, in case that the thickness of the third light extraction module 33 is constant, the area of the reflective surface 6 can be increased to allow more light propagating in a large-angle direction to deflect toward a small-angle after reflection after being reflected by the reflective surface 6.

Exemplarily, in an embodiment of the present disclosure, a first preset distance d1 is formed between an orthographic projection of the first side surface 41 on a plane of the substrate 1 and an orthographic projection of the reflective surface 6 on the plane of the substrate 1. The first preset distance d1 is greater than or equal to 0. As shown in FIG. 1, the first preset distance between the orthographic projection of the first side surface 41 on the plane of the substrate 1 and the orthographic projection of the reflective surface 6 on the plane of the substrate 1 is 0, that is, the orthographic projection of the first side surface 41 on the plane of the substrate 1 is just in contact with the orthographic projection of the reflective surface 6 on the plane of the substrate 1.

Figure 2:
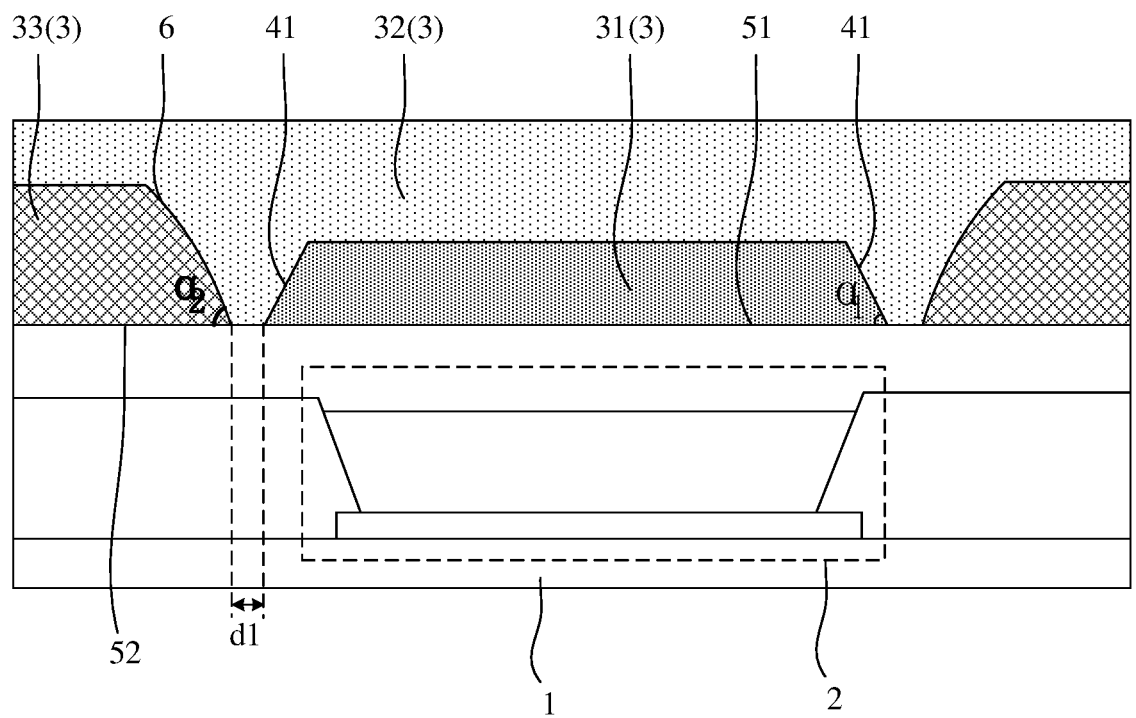
FIG. 2 is a schematic cross-sectional view showing a display panel according to another embodiment of the present disclosure.

FIG. 2 is a schematic cross-sectional view showing a display panel according to another embodiment of the present disclosure. As shown in FIG. 2, in an embodiment of the present disclosure, the first preset distance d1 is greater than 0. With such configuration, the first side surface 41 does not overlap with the reflective surface 6, and thus, the first side surface 41 does not affect the light incident to the reflective surface 6 and that the reflective surface 6 does not affect the light incident to the first side surface 41. That is, with such an embodiment, functions of the first side surface 41 and the reflective surface 6 are better realized.

In an embodiment of the present disclosure, by setting the first preset distance d1 to be greater than 0, when the first light extraction module 31 and the third light extraction module 33 are manufactured separately, the first side surface 41 does not overlap with the reflective surface 6 even if a slight process error occurs. With such configuration, requirements on process precision in a manufacturing process of the display panel can be reduced, thereby reducing process difficulty. In addition, by setting d1 to be greater than 0, the present disclosure can increase an adjustable range of the intersection angle $\alpha_2$ while achieving a function of light refraction of the first side surface 41 and a function of light reflection of the reflective surface 6.

In an embodiment of the present disclosure, in order to enable the display panel to have a touch function so as to enrich use functions of the display panel, at least one touch layer can be provided in the display panel.

Figure 3:
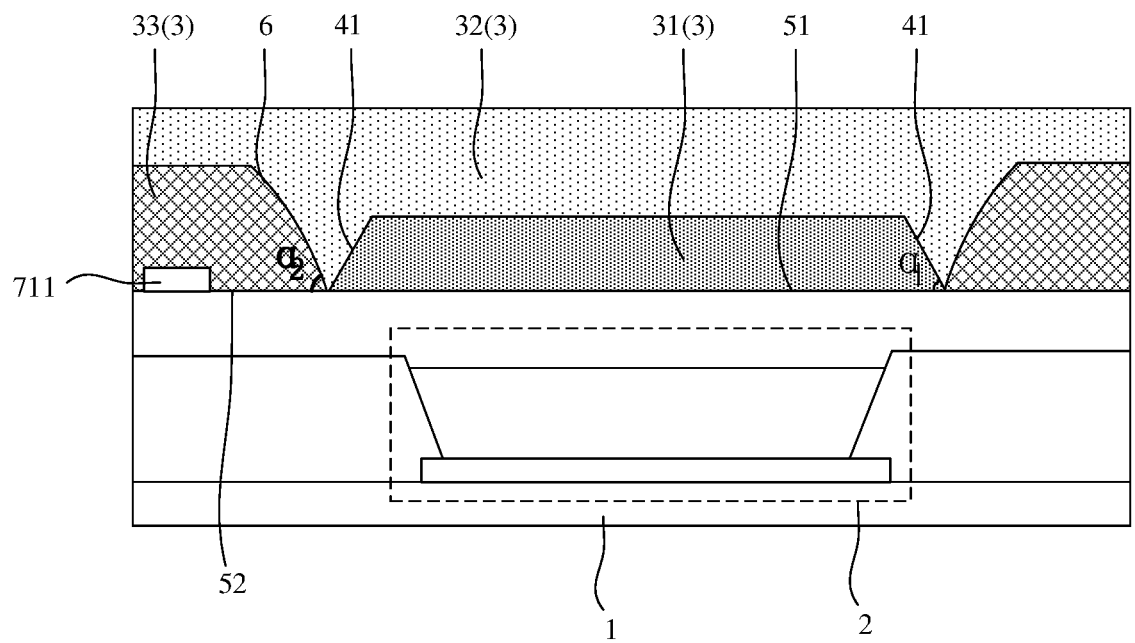
FIG. 3 is a schematic cross-sectional view showing a display panel according to another embodiment of the present disclosure.
Figure 4:
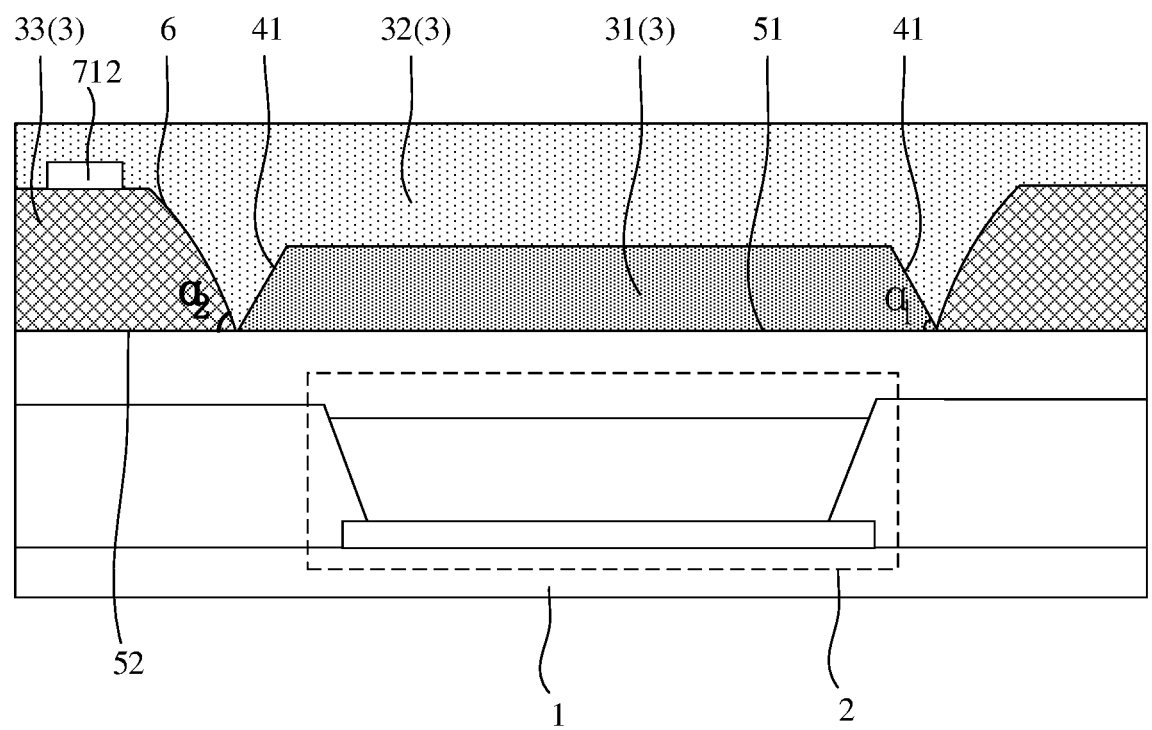
FIG. 4 is a schematic cross-sectional view showing a display panel according to another embodiment of the present disclosure.
Figure 5:
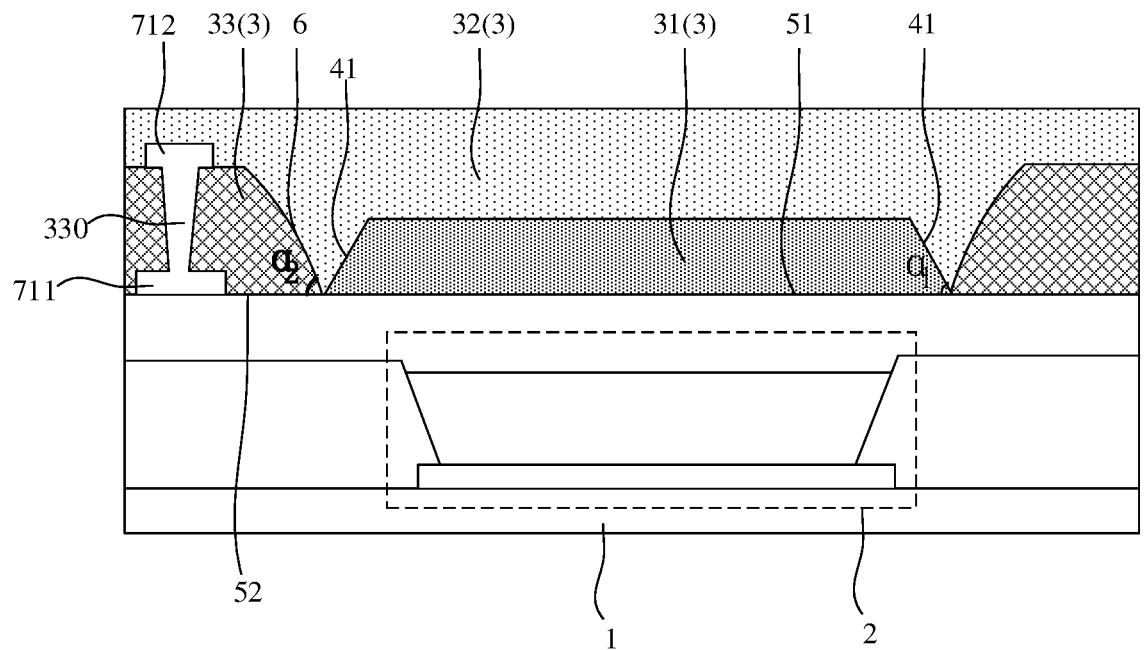
FIG. 5 is a schematic cross-sectional view showing a display panel according to another embodiment of the present disclosure.

As shown in FIG. 3, FIG. 4, and FIG. 5, FIG. 3 to FIG. 5 are schematic cross-sectional views of a display panel according to three embodiments of the present disclosure, respectively. FIG. 3 and FIG. 4 are schematic diagrams showing a touch layer provided in the display panel. FIG. 5 is a schematic diagram showing two touch layers provided in the display panel.

In FIG. 3, the touch layer 711 is located at a side of the third light extraction module 33 facing towards the substrate 1. The third light extraction module 33 can insulate the touch layer 711 from other conductive layers in the display panel, while adjusting the propagation direction of the light incident to the reflective surface 6. That is, the third light extraction module 33 can be reused as a touch insulation layer, so that it is avoided that too many layers are provided in the display panel, thereby reducing the thickness of the display panel.

In FIG. 4, the touch layer 712 is located at a side of the third light extraction module 33 facing away from the substrate 1. The second light extraction module 32 can insulate the touch layer 712 from other conductive layers in the display panel, while covering the first side surface 41 to adjust the propagation direction of the light incident to the first side surface 41. That is, the second light extraction module 32 can be reused as a touch insulation layer, so that it is avoided that too many layers are provided in the display panel, thereby reducing the thickness of the display panel.

In FIG. 5, one touch layer 712 is located at a side of the third light extraction module 33 facing away from the substrate 1, and the other touch layer 711 is located at a side of the third light extraction module 33 facing towards the substrate 1. Each of the second light extraction module 32 and the third light extraction module 33 can serve as a touch insulation layer. The second light extraction module 32 and the third light extraction module 33 can insulate the touch layer 711 and the touch layer 712 from other conductive layers in the display panel, while adjusting the propagation direction of light. That is, the second light extraction module 32 and the third light extraction module 33 can be reused as a touch insulation layer, so that it is avoided that too many layers are provided in the display panel, thereby reducing the thickness of the display panel.

Exemplarily, in an embodiment of the present disclosure, when two touch layers 7 are provided in the display panel, a first via 330 can be provided in the third light extraction module 33. As shown in FIG. 5, the touch layers 711 and 712 that are located at two sides of the third light extraction module 33 are electrically connected through the first via 330. In an embodiment of the present disclosure, when the first via 330 is provided, the first via 330 can be located at a side of the reflective surface 6 facing away from the light-emitting module 2, so that the first via 330 does not affect the light emitted to the reflective surface 6.

Exemplarily, in an embodiment of the present disclosure, when the first light extraction module 31 is provided, the first side surface 41 of the first light extraction module 31 can at least partially overlap with the light-emitting module 2 along a normal direction of the substrate 1, so that more large-angle lights emitted from the light-emitting module 2 are emitted toward the first side surface 41.

In order to realize full-color display with the display panel, in an embodiment of the present disclosure, the light-emitting module 2 can be configured to include light-emitting modules that can emit light of a plurality of colors. For example, in an embodiment of the present disclosure, the light-emitting module 2 can be configured to include a first-color light-emitting module 21, and the light-emitting color of the first-color light-emitting module 21 is the first color.

In an embodiment of the present disclosure, as shown in FIG. 1 to FIG. 5, the first light extraction module 31 can at least partially overlap with the light-emitting module 2 in the normal direction of the substrate 1, that is, the orthographic projection of the first light extraction module 31 on the plane of the substrate 1 can at least partially overlap with the orthographic projection of the light-emitting module 2 on the plane of the substrate 1, and the color of the first light extraction module 31 is the same as a color of light emitted from the light-emitting module 2 overlapping with the first light extraction module 31. The color of the first light extraction module 31 is the color of the light emitted from the first light extraction module 31. With such configuration, the first light extraction module 31 can have a filtering function, that is, the first light extraction module 31 can be reused as a color filter.

In an embodiment of the present disclosure, the first light extraction module 31 can overlap with the light-emitting module 2, and the color of the first light extraction module 31 is the same as the color of the light-emitting module 2 overlapping with the first light extraction module 31, so that the first light extraction module 31 can be used to improve color purity of the display panel and reduce reflectivity of ambient light while the first side surface 41 improves light extraction efficiency of the light-emitting module 2. Moreover, with such configuration, there is no need to provide additional color filter, so that the structure of the display panel can be simplified, thereby reducing the thickness of the display panel.

Figure 6:
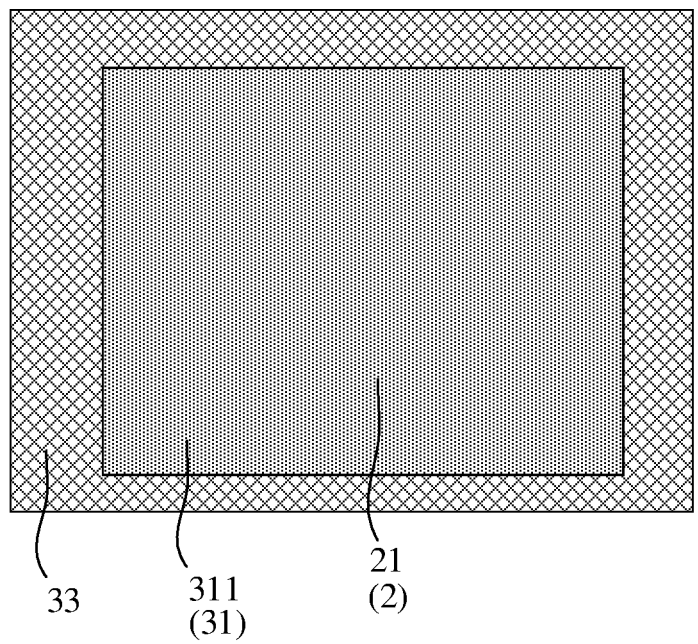
FIG. 6 is a schematic plan view showing a display panel according to an embodiment of the present disclosure.

FIG. 6 is a schematic plan view showing a display panel according to an embodiment of the present disclosure. As shown in FIG. 6, when the light-emitting module 2 includes the first-color light-emitting module 21, correspondingly, the first light extraction module 31 can include a first light extraction sub-module 311 in an embodiment of the present disclosure. The color of the first light extraction sub-module 311 is a first color, that is, a white light is filtered into the light with the first color after passing through the first light extraction sub-module 311. An orthographic projection of the first light extraction sub-module 311 on the plane of the substrate 1 at least partially overlaps with the orthographic projection of the first-color light-emitting module 21 on the plane of the substrate 1.

In an embodiment of the present disclosure, as shown in FIG. 6, the orthographic projection of the first light extraction module 31 can cover the orthographic projection of the light-emitting module 2, so that the light with a front viewing angle emitted from the light-emitting module 2 can emitted from the first light extraction module 31, thereby improving color purity of the display panel.

As shown in FIG. 1 to FIG. 6, in an embodiment of the present disclosure, the third light extraction module 33 does not overlap with the light-emitting module 2 along the normal direction of the substrate 1, so that the small-angle light emitted from the light-emitting module 2 is not affected while the third light extraction module 33 reflects a large-angle refracted light.

Figure 7:
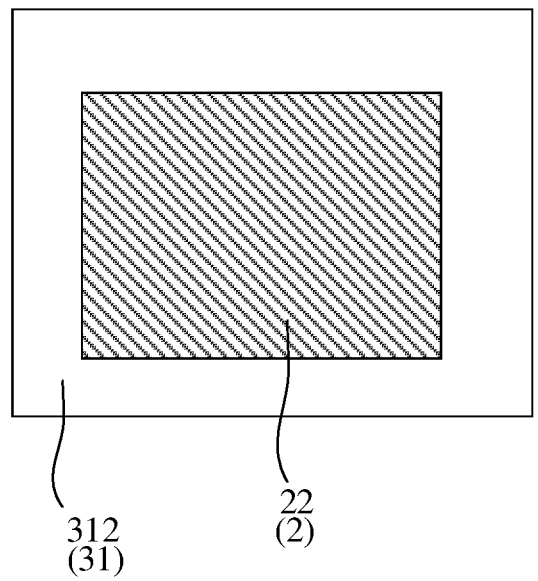
FIG. 7 is a schematic plan view showing a display panel according to another embodiment of the present disclosure.
Figure 8:
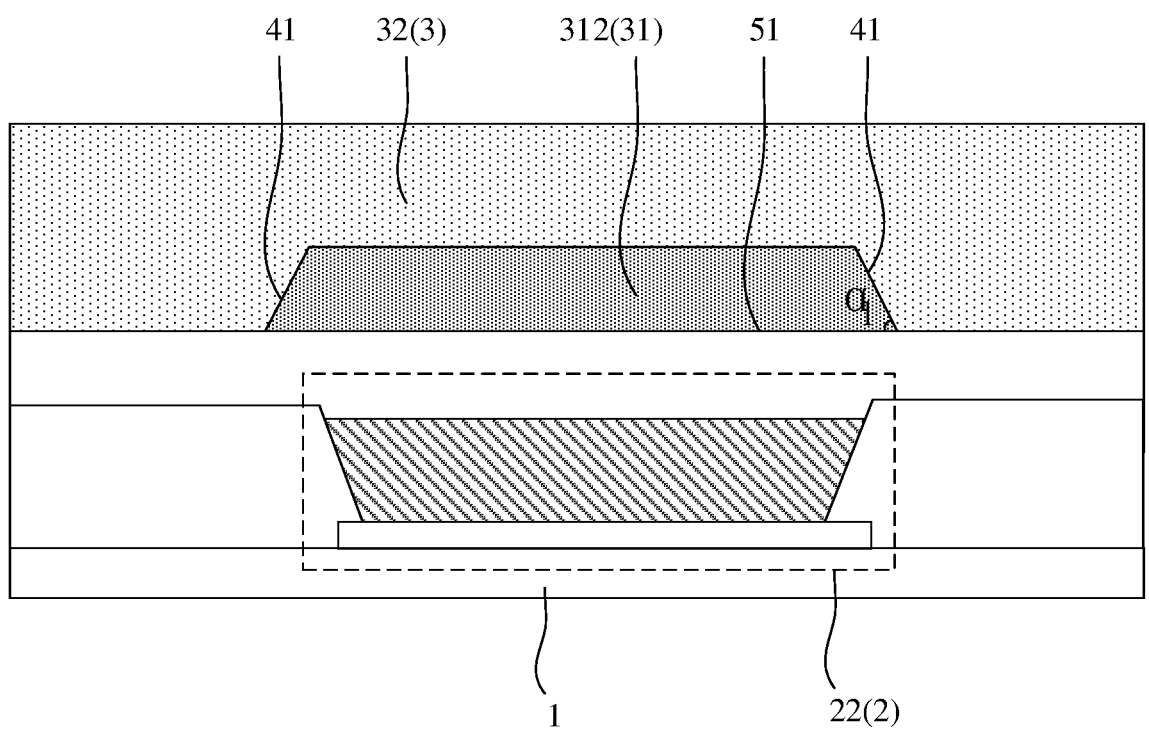
FIG. 8 is a schematic cross-sectional view of FIG. 7.

FIG. 7 is a schematic plan view showing a display panel according to another embodiment of the present disclosure, FIG. 8 is a schematic cross-sectional view of FIG. 7. Exemplarily, as shown in FIGS. 7 and 8, the light-emitting module 2 further includes a second-color light-emitting module 22. A color of light emitted by the second-color light-emitting module 22 is a second color different from the first color. For example, the first color can be blue, and the second color can be red or green.

When the light extraction efficiency of the first-color light-emitting module 21 is different from the second-color light-emitting module 22, e.g., when the light extraction efficiency of the second-color light-emitting module 22 is greater than the light extraction efficiency of the first-color light-emitting module 21, as shown in FIG. 7 and FIG. 8, in an embodiment of the present disclosure, the third light extraction module including the reflective surface cannot be provided at a light-emitting side of the second-color light-emitting module 22, and the third light extraction module 33 can be provided at a light-emitting side of the first-color light-emitting module 21, so that uniformity of the light with different colors is balanced, thereby avoiding a color cast of the display panel.

Figure 9:
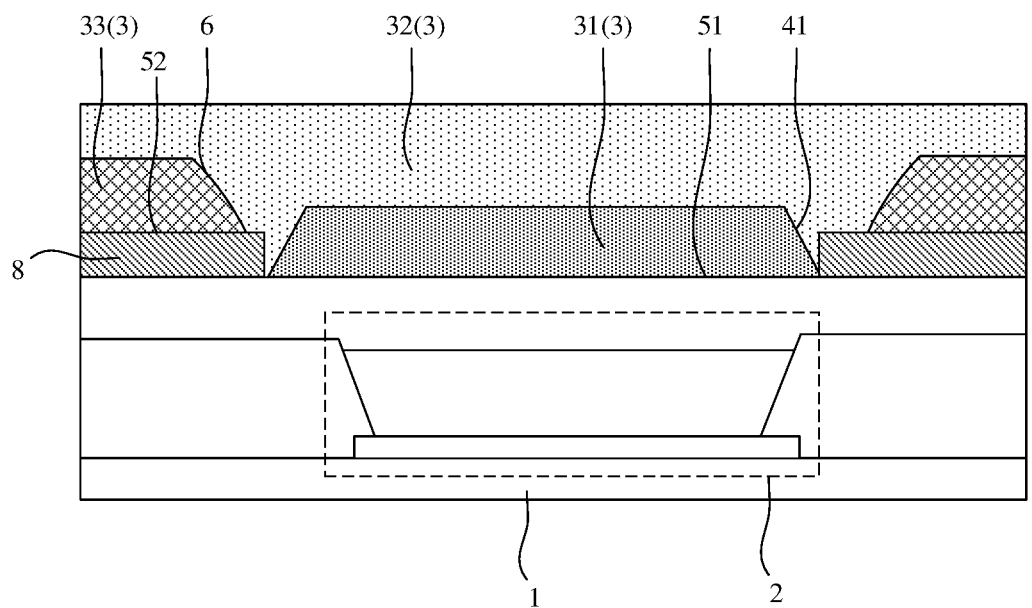
FIG. 9 is a schematic cross-sectional view showing a display panel according to another embodiment of the present disclosure.

FIG. 9 is a schematic cross-sectional view showing a display panel according to another embodiment of the present disclosure. Exemplarily, as shown in FIG. 9, the display panel further includes a black matrix 8. At least a portion of the black matrix 8 is located between two adjacent first light extraction modules 31. The first light extraction module 31 located between two adjacent black matrices 8 has a function of light filtering. In an embodiment of the present disclosure, by providing the black matrix 8, non-display structures including scan lines, data lines, and thin film transistors in an array substrate can be shielded, and mutual interference between light emitted from two adjacent light-emitting modules 2 having different colors can be avoided, thereby achieving display effect of the display panel.

As shown in FIG. 9, in an embodiment of the present disclosure, when the black matrix 8 is provided, the black matrix 8 can be provided at a side of the third light extraction module 33 facing towards the substrate 1, and the second bottom surface 52 of the third light extraction module 33 can be in contact with the black matrix 8. When the display panel is manufactured, the black matrix 8 and the first light extraction module 31 can be manufactured firstly, and then the third light extraction module 33 can be manufactured at a side of the black matrix 8 facing away from the substrate 1.

Exemplarily, as shown in FIG. 9, in an embodiment of the present disclosure, a distance between the orthographic projection of the black matrix 8 on the plane of the substrate 1 and the orthographic projection of the first light extraction module 31 on the plane of the substrate 1 can be 0. That is, the black matrix 8 is just in contact with the first light extraction module 31, so that the small-angle light emitted from the light-emitting module 2 is prevented from being absorbed by the black matrix 8 while achieving that the display panel does not leak light, thereby achieving brightness of the display panel at the front viewing angle.

Figure 10:
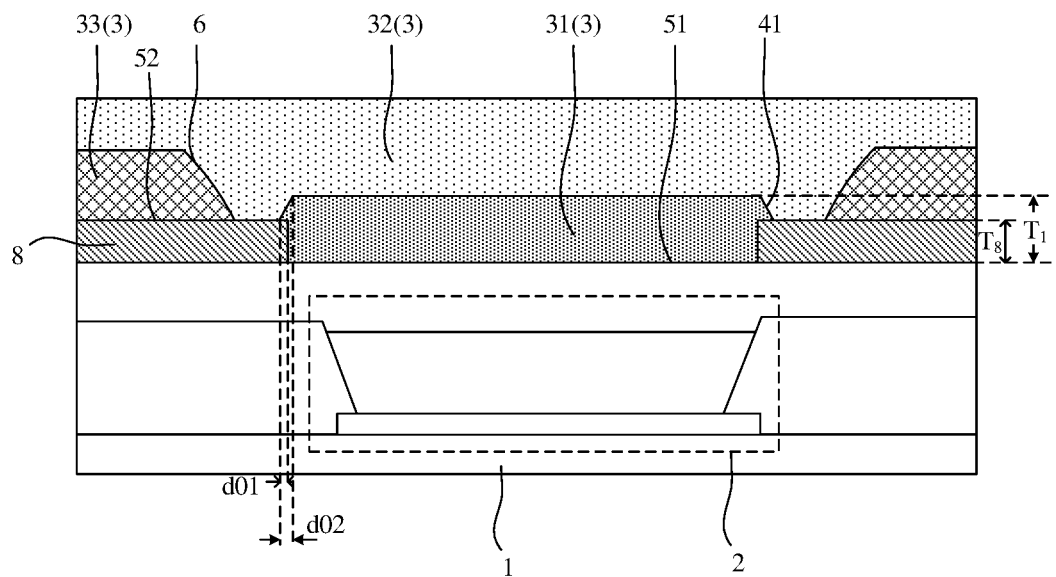
FIG. 10 is a schematic cross-sectional view showing a display panel according to another embodiment of the present disclosure.

FIG. 10 is a schematic cross-sectional view showing a display panel according to another embodiment of the present disclosure. Alternatively, as shown in FIG. 10, in an embodiment of the present disclosure, the black matrix 8 can at least partially overlap with the first light extraction module 31 along the normal direction of the substrate 1. With such configuration, when the black matrix 8 and the first light extraction module 31 are manufactured separately, it is possible that there is no gap formed between the black matrix 8 and the first light extraction module 31 even if there is a slight process error occurs. Since the gap position can leak light, with such configuration, in the process of manufacturing the display panel, the display panel does not leak light even if there is a slight process error, so that requirements on process precision can be reduced in the process of manufacturing the display panel, thereby reducing process difficulty.

In an embodiment of the present disclosure, as shown in FIG. 10, a thickness $T_8$ of the black matrix 8 is smaller than the thickness $T_1$ of the first light extraction module 31.

As shown in FIG. 10, an orthographic projection of a portion of the black matrix 8 overlapping with the first light extraction module 31 on the plane of the substrate 1 has a width d01, and an orthographic projection of the first side surface 41 on the plane of the substrate 1 has a width d02, where d01<d02. With such configuration, the light intensity of the large-angle light emitted from the light-emitting module 2 received by the first side surface 41 is achieved, while requirements on process precision are reduced in the manufacturing process of the display panel.

Figure 11:
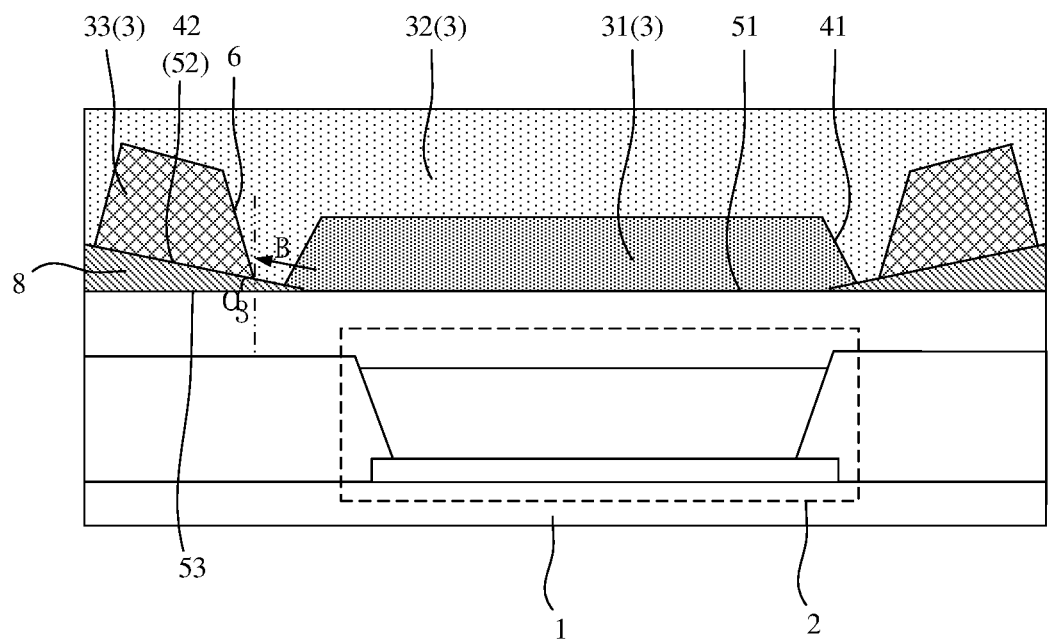
FIG. 11 is a schematic cross-sectional view showing a display panel according to another embodiment of the present disclosure.

FIG. 11 is a schematic cross-sectional view showing a display panel according to another embodiment of the present disclosure. In an embodiment of the present disclosure, as shown in FIG. 11, when the black matrix 8 is configured to overlap with the first light extraction module 31 to avoid light leakage caused by process fluctuations, the black matrix 8 can be configured to include a second side surface 42 and a third bottom surface 53, and an angle $\alpha_3$ formed between the second side surface 42 and the third bottom surface 53 can satisfy: $0°<\alpha_3<90°$. The second side surface 42 is located at a side of the black matrix 8 facing towards the first light extraction module 31. The third bottom surface 53 is located at a side of the black matrix 8 facing towards the substrate 1. The third light extraction module 33 is located at a side of the black matrix 8 facing away from the substrate. The second bottom surface 52 of the third light extraction module 33 is in contact with the second side surface 42 of the black matrix.

In an embodiment of the present disclosure, the angle $\alpha 3$ formed between the second side surface 42 and the third bottom surface 53 satisfies: $0°<\alpha_3<90°$, that is, the second side surface 42 of the black matrix 8 is provided obliquely with respect to the substrate 1. The black matrix 8 has a thickness gradually reducing along a direction from the black matrix 8 to the first light extraction module 31. In this way, the thickness of the portion of the black matrix 8 overlapping with the first light extraction module 31 can be reduced, so that the area of the first side surface 41 that plays a refraction role in the first light extraction module 31 can be achieved, thereby attenuating the effect on the area reduction of the first side surface 41 by providing the black matrix 8. With such configuration, the black matrix 8 is prevented from absorbing excess large-angle refracted lights emitted from the first side surface 41, so that a portion of the large-angle refracted lights is allowed to be incident to the reflective surface 6.

As shown in FIG. 11, if the side surface of the black matrix 8 is perpendicular to the substrate 1 (the side surface perpendicular to the substrate 1 is indicated by a dot-dash line in FIG. 11), the large-angle refracted light B emitted from the first side surface 41 will be absorbed by the vertical side. In an embodiment of the present disclosure, by designing the second side surface 42 to be inclined relative to the substrate 1, the large-angle refracted light B is prevented from being absorbed by the black matrix 8, so that this portion of the large-angle refracted light can be incident to the reflective surface 6 located on the black matrix 8, is reflected by the reflective surface 6 and emits in a small-angle propagation direction, thereby improving light extraction efficiency of the display panel.

In an embodiment of the present disclosure, $10°\leq\alpha_3\leq30°$. In an embodiment of the present disclosure, by setting $\alpha_3\leq30°$, it is possible to avoid setting $\alpha_3$ to be too large, so that the black matrix 8 is prevented from absorbing excessive large-angle refracted lights emitted from the first side surface 41, thereby improving light extraction efficiency of the display panel. On the other hand, in an embodiment of the present disclosure, by setting $\alpha_3\geq10°$, it can be achieved that the light shielding effect at the position corresponding to the second side surface 42 in the black matrix 8 is not affected.

Exemplarily, in the present disclosure, in addition to the above-mentioned solutions shown in FIG. 1 to FIG. 11, in an embodiment of the present disclosure, a reflective metal layer can be provided in the third light extraction module 33, and the reflective surface is provided at a side of the reflective metal layer facing away from the substrate and facing towards the first light extraction module. The large-angle refracted light emitted from the first side surface of the first light extraction module can be reflected by the reflective metal layer after it is incident to the reflective metal layer. The propagation direction of the reflected light can be deflected in a direction close the normal direction of the display panel, so that it is beneficial to improve the light extraction efficiency in the direction of the front viewing angle of the display panel.

When the reflective metal layer is provided, the present disclosure provides a variety of ways, which will be described separately as follows.

Figure 12:
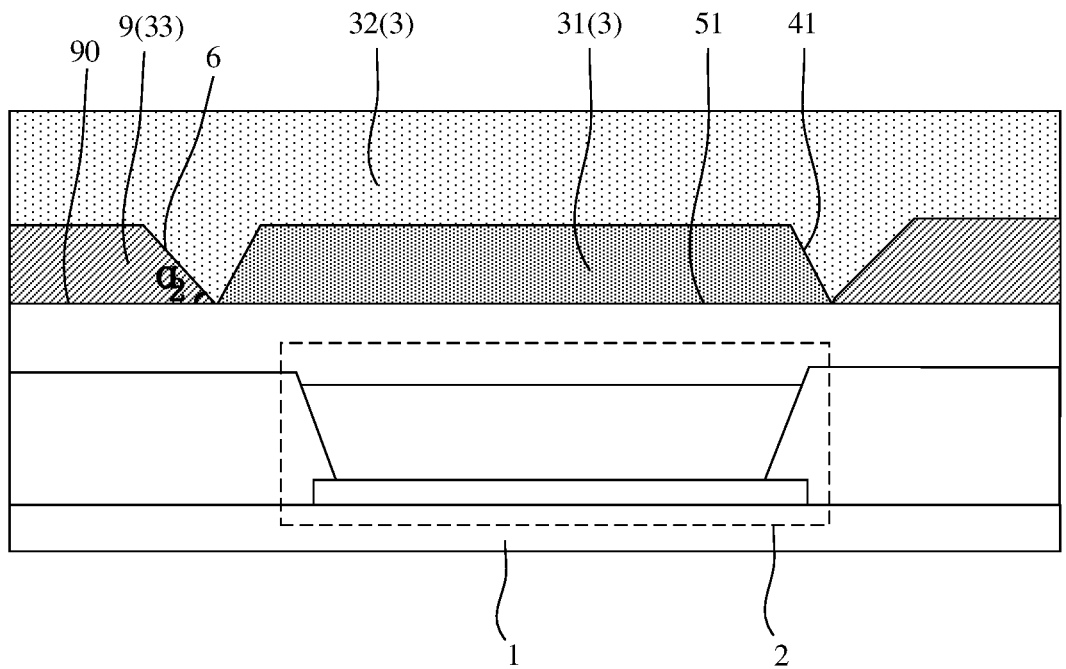
FIG. 12 is a schematic cross-sectional view showing a display panel according to another embodiment of the present disclosure.

FIG. 12 is a schematic cross-sectional view showing a display panel according to another embodiment of the present disclosure. In an embodiment of the present disclosure, as shown in FIG. 12, the reflective metal layer 9 can be selected as the third light extraction module 33, and, a thickness of the reflective metal layer 9 can be gradually reduced along a direction from the reflective metal layer 9 to the first light extraction module 31, so that the surface of the reflective metal layer 9 facing towards the first light extraction module 31 is formed as the inclined reflective surface 6 mentioned above, that is, an angle between the reflective surface 6 and the bottom surface of the reflective metal layer 9 is also $\alpha_2$.

Figure 13:
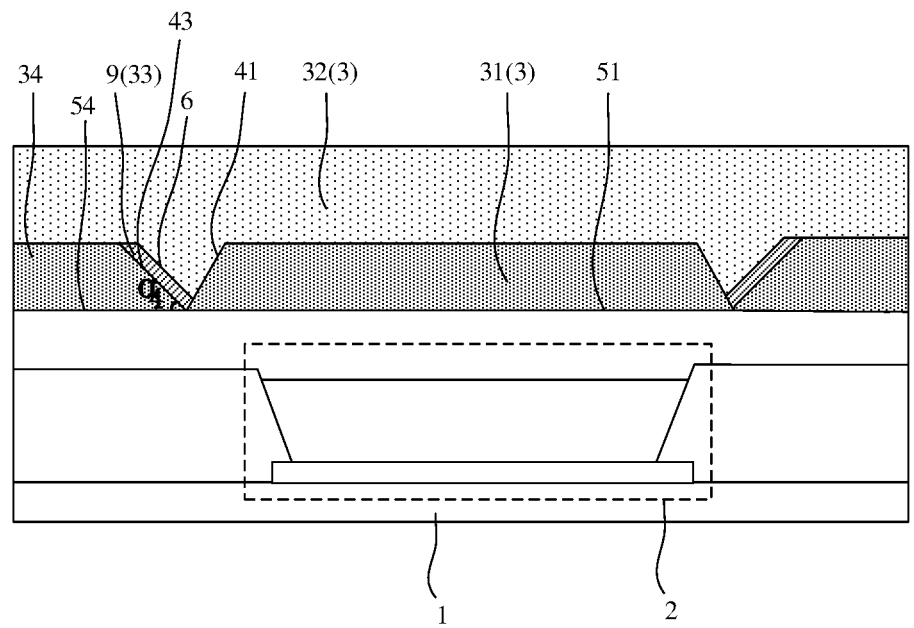
FIG. 13 is a schematic cross-sectional view showing a display panel according to another embodiment of the present disclosure.

FIG. 13 is a schematic cross-sectional view showing a display panel according to another embodiment of the present disclosure. As shown in FIG. 13, in an embodiment of the present disclosure, a fourth light extraction module 34 can be provided in the display panel. The fourth light extraction module 34 includes a third side surface 43 and a fourth bottom surface 54. The third side surface 43 is located at a side of the reflective metal layer 9 facing towards the substrate 1, and is in contact with the reflective metal layer 9. Exemplarily, in an embodiment of the present disclosure, an angle $\alpha_4$ formed between the third side surface 43 and the fourth bottom surface 54 can satisfy $0<\alpha_4\leq90°$. That is, a thickness of the fourth light extraction module 34 can be gradually reduced along a direction from the fourth light extraction module 34 to the first light extraction module 31, so that the third side surface 43 of the fourth light extraction module 34 is inclined.

In an embodiment of the present disclosure, after the fourth light extraction module 34 is manufactured, the reflective metal layer 9 can be manufactured on the third side surface 43 of the fourth light extraction module 34, that is, the fourth light extraction module 34 serves as a substrate of the reflective metal layer 9. The reflective metal layer 9 can be manufactured by layer forming processes, such as deposition and sputtering, so that the reflective metal layer 9 has the same thickness at different positions, and the reflective metal layer 9 is close to the surface of the first light extraction module 31, that is, the reflective surface 6 conforms with the inclination angle of the third side surface 43, i.e., an angle formed between the reflective surface 6 and the plane of the substrate 1 is $\alpha_4$.

In an embodiment of the present disclosure, the fourth light extraction module 34 and the first light extraction module 31 can be formed in the same process, thereby simplifying the manufacturing process of the display panel. Likewise, in an embodiment, the fourth light extraction module 34 is made of the same material as the first light extraction module 31, and has a same refractive index as the first light extraction module 31.

Exemplarily, in an embodiment of the present disclosure, $\alpha_4\geq\alpha_1$. When the thickness of the fourth light extraction module 34 is constant, and the reflective metal layer 9 is in contact with the third side surface 43 of the fourth light extraction module 34. Such configuration can avoid a scenario where the reflective surface 6 does not receive a portion of large-angle light emitted from the first side surface 41 due to a small angle $\alpha_4$. That is, in an embodiment of the present disclosure, by setting $\alpha_4\geq\alpha_1$, the light intensity received by the reflective surface 6 is configured to provide a beneficial increase in the light intensity propagating in a small-angle direction, thereby improving the brightness under a front viewing angle.

In an embodiment of the present disclosure, $\alpha_4$ satisfies: $65°\leq\alpha_4\leq85°$. On one hand, in an embodiment of the present disclosure, by setting $\alpha_4$ to be greater than or equal to $65°$, the propagation direction of the reflected light reflected by the reflective surface 6 can be closer to the normal direction of the display panel, so that the propagation direction of the light emitted from the reflective surface 6 can be as close as possible to the normal direction of the display panel. On the other hand, in an embodiment of the present disclosure, by setting $\alpha_4$ smaller than or equal to $85°$, when the thickness of the fourth light extraction module 34 is constant, and the reflective metal layer 6 is in contact with the fourth light extraction module 34, the area of the reflective surface 6 can be increased, so that more light propagating in a large-angle direction deflects to a small-angle direction after being reflected by the reflective surface 6, thereby improving light extraction efficiency of the display panel.

Exemplarily, in an embodiment of the present disclosure, a second preset distance d2 is formed between the orthographic projection of the first side surface 41 on the plane of the substrate 1 and the orthographic projection of the third side surface 43 on the plane of the substrate 1, and the second preset distance d2 is greater than or equal to 0. As shown in FIG. 13, the second preset distance formed between the orthographic projection of the first side surface 41 on the plane of the substrate 1 and the orthographic projection of the third side surface 43 on the plane of the substrate 1 is 0, that is, the orthographic projection of the first side surface 41 on the plane of the substrate 1 is just in contact with the orthographic projection of the third side surface 43 on the plane of the substrate 1.

Figure 14:
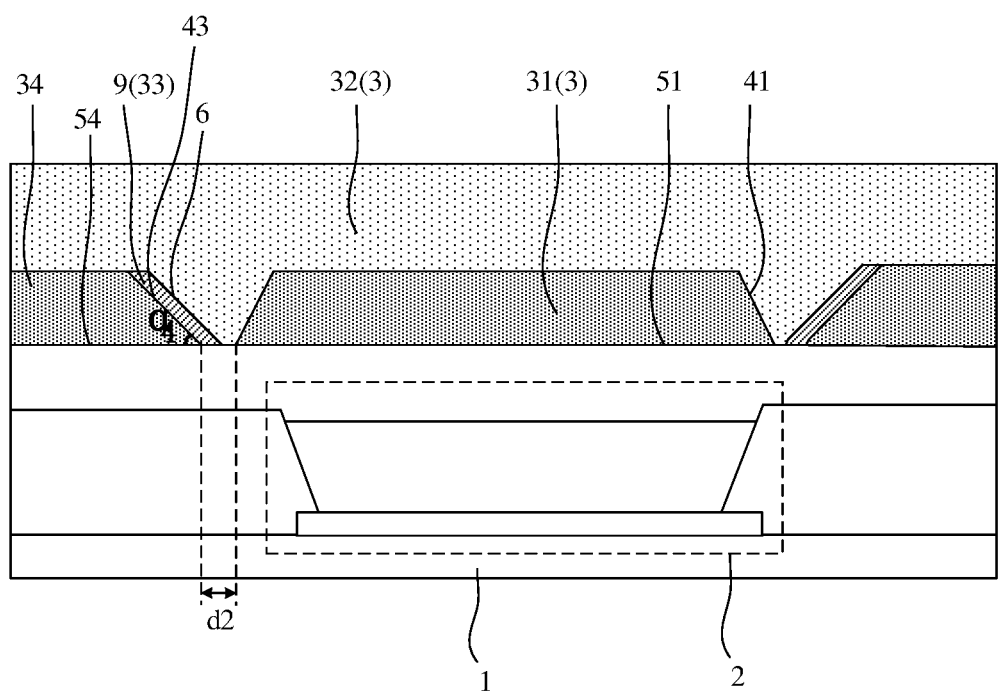
FIG. 14 is a schematic cross-sectional view showing a display panel according to another embodiment of the present disclosure.

FIG. 14 is a schematic cross-sectional view showing a display panel according to another embodiment of the present disclosure. As shown in FIG. 14, the second preset distance d2 formed between the orthographic projection of the first side surface 41 on the plane of the substrate 1 and the orthographic projection of the third side surface 43 on the plane of the substrate 1 is greater than 0. By setting the second preset distance d2 to be greater than 0, when the reflective metal layer 9 is subsequently formed at a side of the third side surface 43 facing away from the substrate 1, the first side surface 41 does not overlap with the reflective surface 6 of the reflective metal layer 9 formed on the third side surface 43. In this regard, in an embodiment, the first side surface 41 does not affect the light incident to the reflective surface 6, and the reflective surface 6 does not affect the light incident to the first side surface 41. That is, functions achieved by the first side surface 41 and the reflective surface 6 are better realized.

In an embodiment of the present disclosure, by setting the second preset distance d2 to be greater than 0, an adjustable range of inclination angle of the reflective surface 6 in the third light extraction module 33 relative to the substrate 1 can be increased while achieving a light refraction function of the first side surface 41 and a light reflection function of the reflective surface 6.

Exemplarily, the reflective metal layer 9 can receive an electrical signal, or does not receive the electrical signal, that is, the reflective metal layer 9 is in a floating state, which is not limited in the present disclosure.

Figure 15:
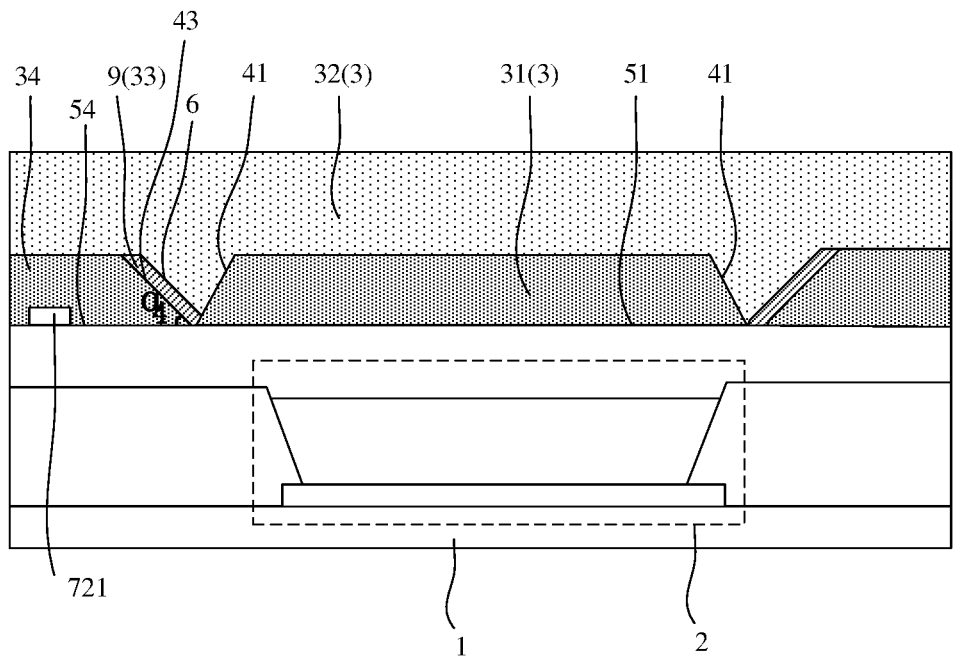
FIG. 15 is a schematic cross-sectional view showing a display panel according to another embodiment of the present disclosure.
Figure 16:
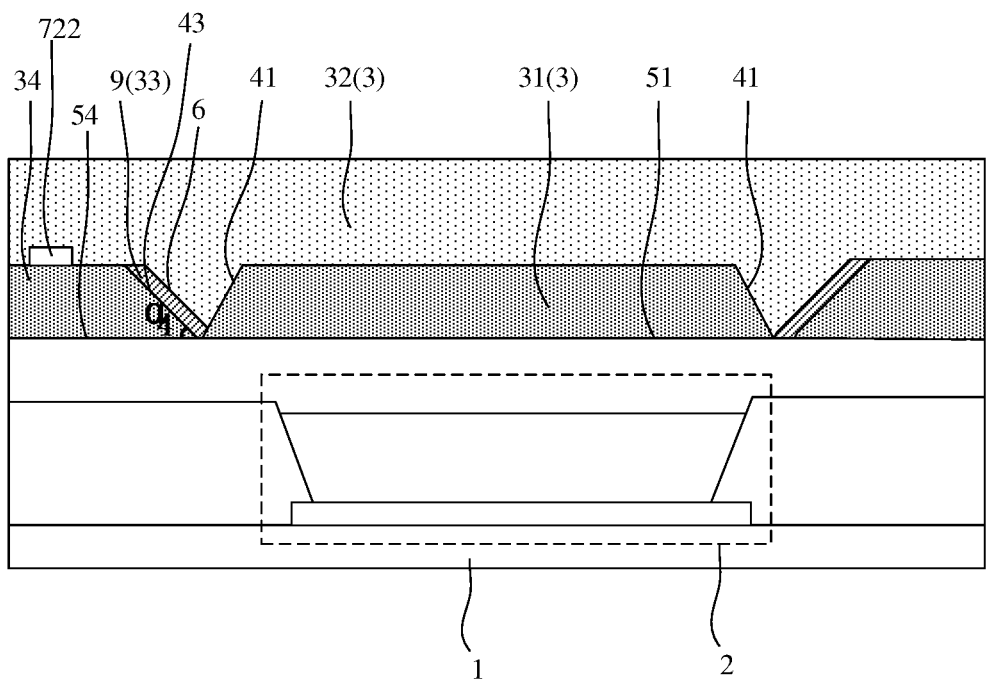
FIG. 16 is a schematic cross-sectional view showing a display panel according to another embodiment of the present disclosure.
Figure 17:
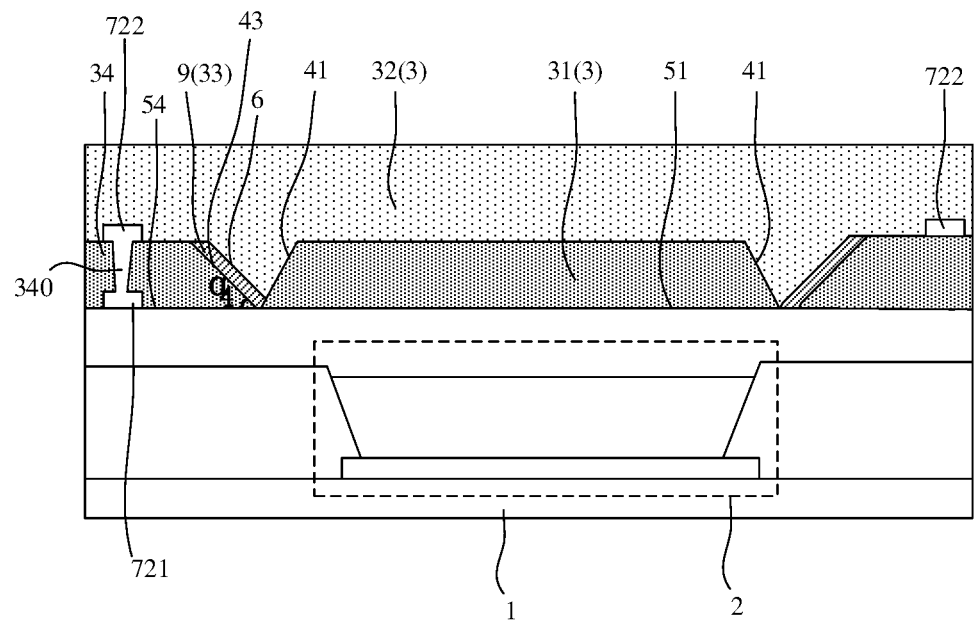
FIG. 17 is a schematic cross-sectional view showing a display panel according to another embodiment of the present disclosure.

In an embodiment of the present disclosure, in case that the reflective metal layer 9 is provided to reflect the large-angle refracted light emitted from the first side surface 41, at least one touch layer can be provided in the display panel, so that a touch function is integrated in the touch panel. As shown in FIGS. 15 to 17, FIG. 15 to FIG. 17 are schematic cross-sectional views of three display panels according to embodiments of the present disclosure. FIG. 15 and FIG. 16 are a schematic diagram showing one touch layer provided in the display panel. FIG. 17 is a schematic diagram showing two touch layers provided in the display panel.

In FIG. 15, the touch layer 721 is located at a side of the fourth light extraction module 34 facing towards the substrate 1. The fourth light extraction module 34 can adjust an inclination angle of the reflective surface 6 of the reflective metal layer 9 so as to adjust the propagation direction of the light, and can also insulate the touch layer 721 from other conductive layers in the display panel. Such configuration is equivalent to reusing the fourth light extraction module 34 as a touch insulation layer, so that it can be avoided that too many layers are provided in the display panel, thereby reducing thickness of the display panel.

In FIG. 16, the touch layer 722 is located at a side of the fourth light extraction module 34 facing away from the substrate 1. Exemplarily, the touch layer 722 is provided in the same layer as the reflective metal layer 9. In an embodiment of the present disclosure, the reflective metal layer 9 and the touch layer 722 is formed by the same process. The reflective metal layer 9 and the touch layer 722 can be connected to each other, or can be disconnected. That is, the reflective metal layer 9 can be connected to a touch signal, or are not be connected to an electrical signal. While covering the first side surface 41 to change the propagation direction of light, the second light extraction module 32 can insulate the touch layer 722 from other conductive layers in the display panel. Such configuration is equivalent to reusing the second light extraction module 32 as a touch insulation layer, to provide fewer layers in the display panel, thereby reducing thickness of the display panel.

In FIG. 17, one touch layer 722 is located at a side of the fourth light extraction module 34 facing away from the substrate 1, and the other touch layer 721 is located at a side of the fourth light extraction module 34 facing towards the substrate 1. Such configuration is equivalent to reusing the second light extraction module 32 and the fourth light extraction module 34 as a touch insulation layer, respectively, thereby providing fewer layers in the display panel, and reducing the thickness of the display panel.

Exemplarily, in an embodiment of the present disclosure, when two touch layers are provided in the display panel, the second via 340 can be provided in the fourth light extraction module 34. As shown in FIG. 17, the touch layer 721 and the touch layer 722 located at two sides of the fourth light extraction module 34 are electrically connected to each other by the second via 340. In an embodiment of the present disclosure, when the second via 340 is provided, the second via 340 can be located at a side of the third side surface 43 facing away from the light-emitting module 2, in which the third side surface 43 is located at a side of the reflective surface 6 facing away from the light-emitting module 2, so that the second via 340 does not affect the light emitted to the reflective surface 6.

In an embodiment of the present disclosure, as shown in FIG. 13 to FIG. 17, when the first light extraction module 31 is arranged, the first light extraction module 31 can at least partially overlap with the light-emitting module 2 along the normal direction of the substrate 1, and the color of the first light extraction module 31 can be the same as the color of light emitted from the light-emitting module 2 overlapping with the first light extraction module 31. The first light extraction module 31 has the same color as the light emitted from the first light extraction module 31. With such configuration, the first light extraction module 31 can have a filtering function, which is equivalent to reusing the first light extraction module 31 as a color filter.

In an embodiment of the present disclosure, the first light extraction module 31 overlaps with the light-emitting module 2, and the color of the first light extraction module 31 is the same as the color of the light-emitting module 2 overlapping with the first light extraction module 31, so that the first side surface 41 can improve the light extraction efficiency of the light-emitting module 2 and the first light extraction module 31 can be used to improve the color purity of the display panel and reduce the reflectivity of ambient light. With such configuration, there is no need for additional color filter, so that the structure of the display panel can be simplified, thereby reducing the thickness of the display panel.

In an embodiment of the present disclosure, as shown in FIGS. 13-17, the fourth light extraction module 34 can have a corresponding light filtering function, so that the fourth light extraction module 34 is formed with the same process as the first light extraction module 31.

Exemplarily, in an embodiment of the present disclosure, the fourth light extraction module 34 can be reused as a touch insulation layer, and the first light extraction module 31 can be reused as a color filter.

Figure 18:
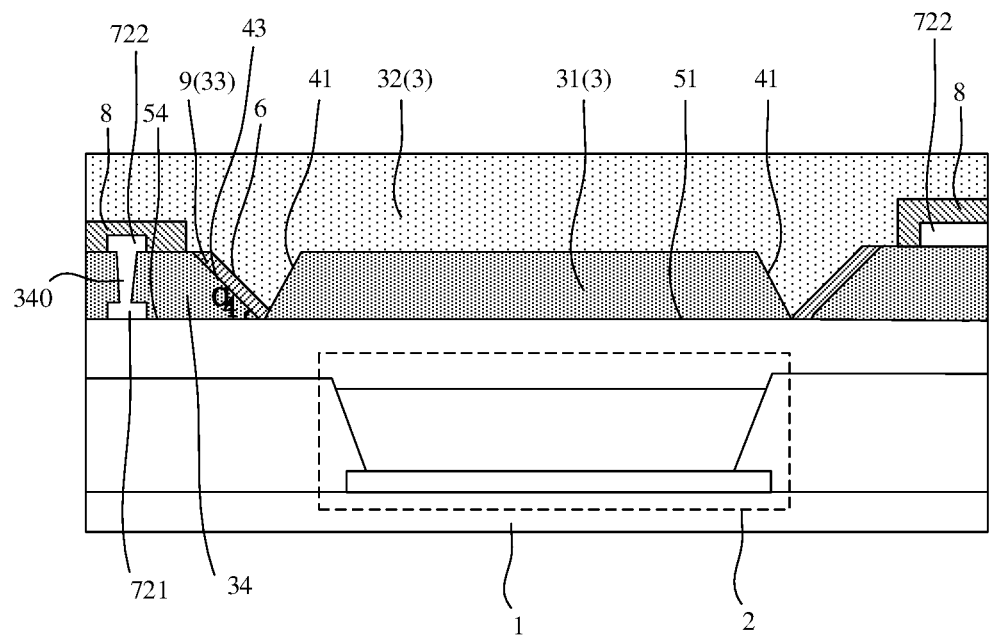
FIG. 18 is a schematic cross-sectional view showing a display panel according to another embodiment of the present disclosure.

FIG. 18 is a schematic cross-sectional view showing a display panel according to another embodiment of the present disclosure. In an embodiment of the present disclosure, as shown in FIG. 18, the display panel further includes a black matrix 8. At least a portion of the black matrix 8 is located between two adjacent first light extraction modules 31. The first light extraction module 31 located between two adjacent black matrices 8 has a light filtering function. In an embodiment of the present disclosure, by providing the black matrix 8, non-display structures including scan lines, data lines, and thin film transistors in an array substrate can be shielded, and mutual interference between lights emitted from two adjacent light-emitting modules 2 having different colors can be avoided, thereby achieving display effect of the display panel.

In an embodiment of the present disclosure, as shown in FIG. 18, the black matrix 8 can be provided at a side of the reflective metal layer 9 facing away from the light-emitting module 2, and does not overlap with the reflective metal layer 9, so as to prevent the light output of the light-emitting module 2 from being affected by the black matrix 8.

As shown in FIG. 18, along the normal direction of the substrate 1, the black matrix 8 is located at a side of the fourth light extraction module 34 facing away from the substrate 1.

Figure 19:
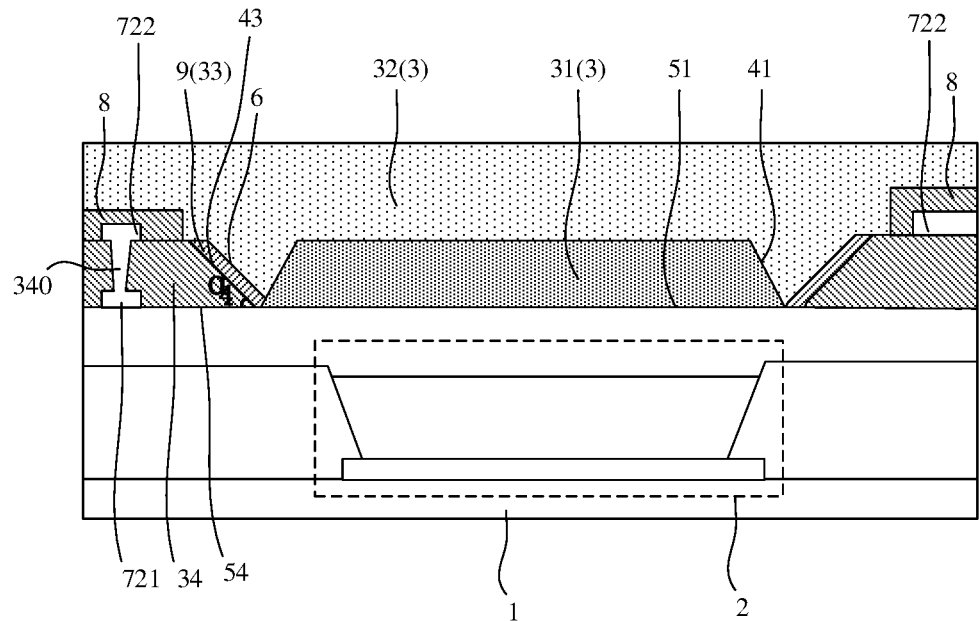
FIG. 19 is a schematic cross-sectional view showing a display panel according to another embodiment of the present disclosure.

FIG. 19 is a schematic cross-sectional view showing a display panel according to another embodiment of the present disclosure. As shown in FIG. 19, in an embodiment of the present disclosure, the fourth light extraction module 34 can be made of a same material as the black matrix 8.

Figure 20:
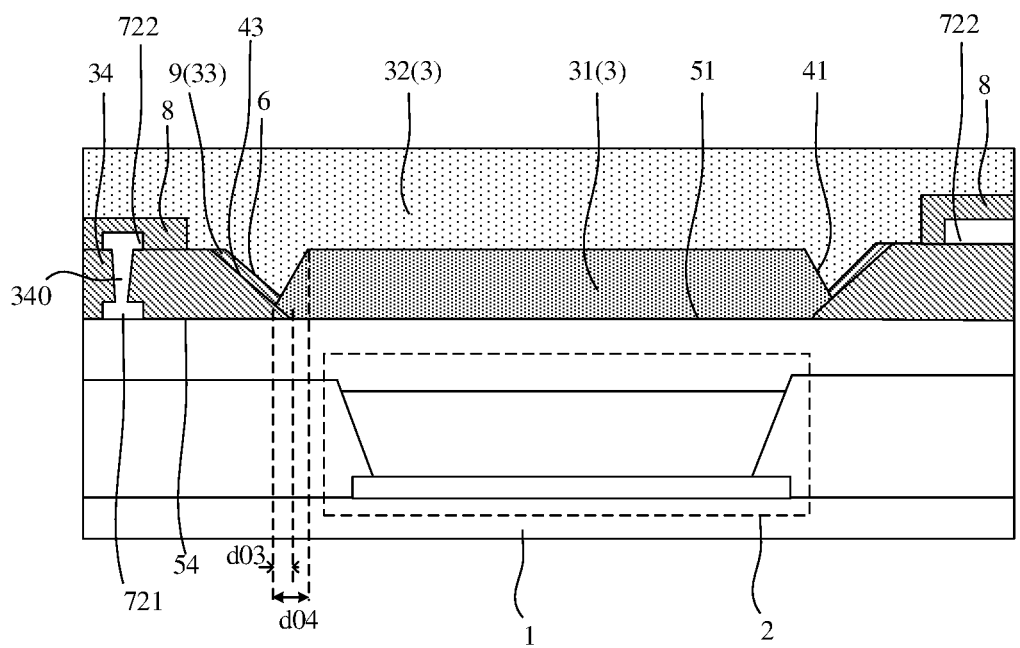
FIG. 20 is a schematic cross-sectional view showing a display panel according to another embodiment of the present disclosure.

FIG. 20 is a schematic cross-sectional view showing a display panel according to another embodiment of the present disclosure. Exemplarily, as shown in FIG. 20, in an embodiment of the present disclosure, the black matrix 8 can at least partially overlap with the first light extraction module 31 along the normal direction of the substrate 1. With such configuration, when the black matrix 8 and the first light extraction module 31 are manufactured separately, it can be achieved that there is no gap formed between the black matrix 8 and the first light extraction module 31 even if there is a slight process error occurs. Since the gap position can leak light, with such configuration, in the process of manufacturing the display panel, the display panel does not leak light even if there is a slight process error, so that requirements on process precision can be reduced in the process of manufacturing the display panel, thereby reducing process difficulty.

In an embodiment of the present disclosure, as shown in FIG. 20, the thickness of the black matrix 8 is gradually reduced along a direction from the black matrix 8 to the first light extraction module 31. In this way, the thickness of the portion of the black matrix 8 overlapped with the first light extraction module 31 can be reduced, so that the area of the first side surface 41 that plays a refraction role in the first light extraction module 31 can be achieved, thereby attenuating the effect on the area reduction of the first side surface 41 by providing the black matrix 8. With such configuration, the black matrix 8 is prevented from absorbing excess large-angle refracted lights emitted from the first side surface 41, so that a portion of the large-angle refracted lights is allowed to be incident to the reflective surface 6.

Referring to FIG. 20, the orthographic projection of a portion of the black matrix 8 overlapped with the first light extraction module 31 on the plane of the substrate 1 has a width d03, the orthographic projection of the first side surface 41 on the plane of the substrate 1 has a width d04, where d03<d04. With such configuration, the light intensity of the large-angle light emitted from the light-emitting module 2 and received by the first side surface 41 is achieved, while requirements on the process precision are reduced in the manufacturing process of the display panel.

Figure 21:
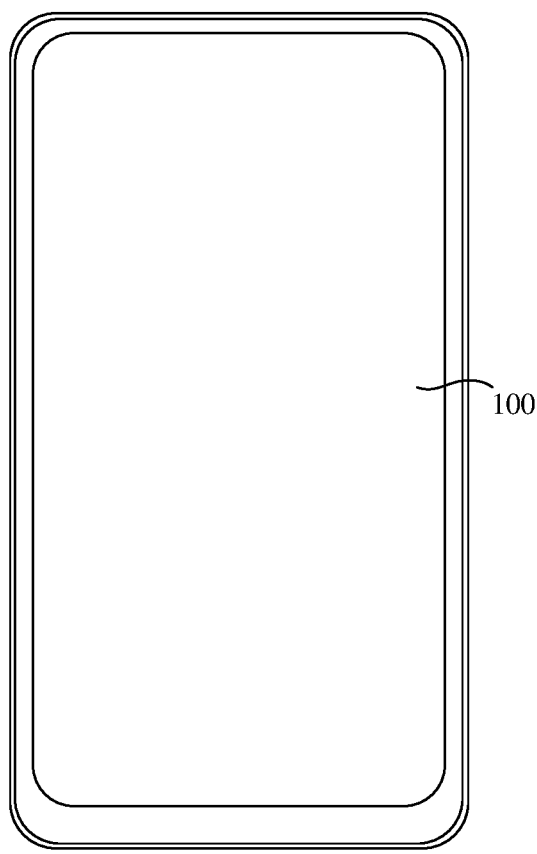
FIG. 21 is a schematic diagram showing a display apparatus according to an embodiment of the present disclosure.

The present disclosure further provides a display apparatus. FIG. 21 is a schematic diagram showing a display apparatus according to an embodiment of the present disclosure. As shown in FIG. 21, the display apparatus includes the display panel 100. The specific structure of the display panel 100 has been described in detail in the above embodiments, and will not be repeated herein. It is appreciated that the display apparatus shown in FIG. 21 is only for schematic illustration, and the display apparatus can be any electronic device having a display function, such as a mobile phone, a tablet computer, a laptop computer, an electronic paper book, a television, a smart watch, and the like.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display panel, comprising:
    a substrate;
    light-emitting modules located at a side of the substrate;
    a first light extraction module located at a side of one light-emitting module of the light-emitting modules facing away from the substrate, wherein the first light extraction module comprises a first side surface and a first bottom surface that faces towards the substrate, wherein an angle $\alpha_1$ formed between the first side surface and the first bottom surface satisfies $0<\alpha_1 \leq 90°$;
    a second light extraction module located at a side of the first light extraction module facing away from the substrate, wherein the second light extraction module is in contact with the first side surface and has a refractive index $n_2$, and the first light extraction module has a refractive index $n_1$, where $n_2<n_1$; and
    a third light extraction module located at a side of the second light extraction module facing towards the substrate, wherein the third light extraction module comprises a reflective surface located at a side of the third light extraction module close to the first side surface,
    wherein the third light extraction module comprises a second bottom surface close to the substrate, wherein the reflective surface is in contact with the second light extraction module, and wherein an angle $\alpha_2$ formed between the reflective surface and the second bottom surface satisfies: $0<\alpha_2 \leq 90°$; and
    wherein the third light extraction module has a refractive index $n_3$, where $n_3<n_2$.

2. The display panel according to claim 1, wherein $40° \leq \alpha_1 \leq 60°$.

3. The display panel according to claim 1, wherein the third light extraction module has a thickness T3, and the first light extraction module has a thickness T1, where T3≥T1.

4. The display panel according to claim 1, wherein $\alpha_2 \geq \alpha_1$.

5. The display panel according to claim 1, wherein a first preset distance is formed between an orthographic projection of the first side surface on a plane of the substrate and an orthographic projection of the reflective surface on the plane of the substrate, and wherein the first preset distance is greater than or equal to 0.

6. The display panel according to claim 1, further comprising:
    at least one touch layer located at a side of the third light extraction module facing towards or facing away from the substrate.

7. The display panel according to claim 1, wherein the first light extraction module at least partially overlaps with one of the light-emitting modules along a normal direction of the substrate, and wherein a color of the first light extraction module is the same as a color of light emitted from the one of the light-emitting modules overlapping with the first light extraction module.

8. The display panel according to claim 7, further comprising:
    a black matrix located at a side of the third light extraction module facing towards the substrate, wherein the black matrix at least partially overlaps with the first light extraction module along the normal direction of the substrate.

9. The display panel according to claim 8, wherein the black matrix comprises:
    a second side surface located at a side of the black matrix close to the first light extraction module, and
    a third bottom surface located at a side of the black matrix facing towards the substrate,
    wherein an angle $\alpha_3$ formed between the second side surface and the third bottom surface satisfies: $0°<\alpha3<90°$; and wherein the third light extraction module is in contact with the second side surface.

10. The display panel according to claim 1, wherein the third light extraction module comprises a reflective metal layer, and wherein the reflective surface is located at a side of the reflective metal layer facing away from the substrate.

11. A display panel, comprising:
    a substrate;
    light-emitting modules located at a side of the substrate;
    a first light extraction module located at a side of one light-emitting module of the light-emitting modules facing away from the substrate, wherein the first light extraction module comprises a first side surface and a first bottom surface that faces towards the substrate, wherein an angle $\alpha_1$ formed between the first side surface and the first bottom surface satisfies $0<\alpha_1\leq90°$;

a second light extraction module located at a side of the first light extraction module facing away from the substrate, wherein the second light extraction module is in contact with the first side surface and has a refractive index $n_2$, and the first light extraction module has a refractive index $n_1$, where $n_2<n_1$; and a third light extraction module located at a side of the second light extraction module facing towards the substrate, wherein the third light extraction module comprises a reflective surface located at a side of the third light extraction module close to the first side surface; wherein the third light extraction module comprises a reflective metal layer, and the reflective surface is located at a side of the reflective metal layer facing away from the substrate; wherein the third light extraction module comprises a second bottom surface close to the substrate, wherein the reflective surface is in contact with the second light extraction module, and wherein an angle $\alpha_2$ formed between the reflective surface and the second bottom surface satisfies: $0<\alpha_2\leq90$; and wherein the third light extraction module has a refractive index $n_3$, where $n_3<n_2$;

a fourth light extraction module, wherein the fourth light extraction module comprises a third side surface and a fourth bottom surface, and an angle $\alpha_4$ formed between the third side surface and the fourth bottom surface satisfies: $a_4\leq90°$;

wherein the third side surface is located at a side of the reflective metal layer facing towards the substrate, and is in contact with the reflective metal layer, and the fourth light extraction module and the first light extraction module are formed in a same layer.

12. The display panel according to claim 11, wherein $\alpha_4\geq\alpha_1$.

13. The display panel according to claim 11, wherein a second preset distance is formed between an orthographic projection of the first side surface on a plane of the substrate and an orthographic projection of the third side surface on the plane of the substrate, and wherein the second preset distance is greater than or equal to 0.

14. The display panel according to claim 11, further comprising:

at least one touch layer located at a side of the fourth light extraction module facing towards or facing away from the substrate.

15. The display panel according to claim 14, wherein the at least one touch layer and the reflective metal layer are arranged in a same layer.

16. The display panel according to claim 11, wherein the first light extraction module at least partially overlaps with one of the light-emitting modules along a normal direction of the substrate; and wherein a color of the first light extraction module is the same as a color of light emitted from the one of the light-emitting modules overlapping with the first light extraction module.

17. The display panel according to claim 16, further comprising:

a black matrix at least partially overlapping with the first light extraction module along the normal direction of the substrate.

18. The display panel according to claim 17, wherein the black matrix has a thickness gradually reducing along a direction from the black matrix to the first light extraction module.

19. A display apparatus, comprising a display panel, wherein the display panel comprises:

a substrate;

light-emitting modules located at a side of the substrate;

a first light extraction module located at a side of one light-emitting module of the light-emitting modules facing away from the substrate, wherein the first light extraction module comprises a first side surface and a first bottom surface that faces towards the substrate, wherein an angle $\alpha_1$ formed between the first side surface and the first bottom surface satisfies $0<\alpha_1\leq90°$;

a second light extraction module located at a side of the first light extraction module facing away from the substrate, wherein the second light extraction module is in contact with the first side surface and has a refractive index $n_2$, and the first light extraction module has a refractive index $n_1$, where $n_2<n_1$; and a third light extraction module located at a side of the second light extraction module facing towards the substrate, wherein the third light extraction module comprises a reflective surface located at a side of the third light extraction module close to the first side surface, wherein the third light extraction module comprises a second bottom surface close to the substrate, wherein the reflective surface is in contact with the second light extraction module, and wherein an angle $\alpha_2$ formed between the reflective surface and the second bottom surface satisfies: $0<\alpha_2\leq90$; and wherein the third light extraction module has a refractive index $n_3$, where $n_3<n_2$.

* * * * *